(12) United States Patent
Cha

(10) Patent No.: US 9,181,847 B2
(45) Date of Patent: Nov. 10, 2015

(54) COATING MATERIAL FOR PARTS OF ENGINE EXHAUST SYSTEM AND METHOD FOR MANUFACTURING THE SAME

(71) Applicant: Hyundai Motor Company, Seoul (KR)

(72) Inventor: Sung-Chul Cha, Seoul (KR)

(73) Assignee: Hyundai Motor Company, Seoul (KR)

( * ) Notice: Subject to any disclaimer, the term of this patent is extended or adjusted under 35 U.S.C. 154(b) by 85 days.

(21) Appl. No.: 13/755,106

(22) Filed: Jan. 31, 2013

(65) Prior Publication Data

US 2014/0099489 A1 Apr. 10, 2014

(30) Foreign Application Priority Data

Oct. 4, 2012 (KR) .................. 10-2012-0110234

(51) Int. Cl.
*C23C 14/34* (2006.01)
*F01N 13/16* (2010.01)
*C23C 14/06* (2006.01)
*C23C 14/35* (2006.01)
*C23C 28/00* (2006.01)

(52) U.S. Cl.
CPC ............ *F01N 13/16* (2013.01); *C23C 14/0641* (2013.01); *C23C 14/352* (2013.01); *C23C 28/322* (2013.01); *C23C 28/34* (2013.01); *F01N 2510/00* (2013.01); *Y10T 428/24975* (2015.01)

(58) Field of Classification Search
CPC C23C 14/0641; C23C 14/352; C23C 28/322; C23C 28/34; F01N 13/16; F01N 2510/00; Y10T 428/24975
USPC .............. 204/192.12, 192.15, 192.16, 192.38
See application file for complete search history.

(56) References Cited

U.S. PATENT DOCUMENTS

2009/0123737 A1* 5/2009 Yasui et al. ................... 428/336
2010/0044968 A1* 2/2010 Fischer et al. ................ 277/443

FOREIGN PATENT DOCUMENTS

| JP | 2008007835 A | 1/2008 |
| JP | 2009263717 A | 11/2009 |
| JP | 2011190529 A | 9/2011 |

* cited by examiner

*Primary Examiner* — Rodney McDonald
(74) *Attorney, Agent, or Firm* — Mintz Levin Cohn Ferris Glovsky and Popeo, P.C.; Peter F. Corless

(57) ABSTRACT

Disclosed is a coating material for parts of an engine exhaust system and a method for manufacturing the same. The coating material includes a second junction layer made of CrN or Ti(C)N, a support layer made of TiAlN/CrN disposed on a surface of the second junction layer, and a functional layer made of TiAlN/CrSiN or TiAlN/CrSiCN disposed on a surface of the support layer. The coating material improves abrasion resistance and seizure resistance of the parts of the engine exhaust system.

4 Claims, 3 Drawing Sheets

COATING MATERIAL FOR PARTS OF ENGINE EXHAUST SYSTEM AND METHOD FOR MANUFACTURING THE SAME

CROSS-REFERENCE TO RELATED APPLICATION

This application claims priority under 35 U.S.C. §119 to Korean Patent Application No. 10-2012-110234, filed on Oct. 4, 2012, in the Korean Intellectual Property Office, the disclosure of which is incorporated herein by reference in its entirety.

BACKGROUND (a) Technical Field

The present disclosure relates to a coating material for parts of an engine exhaust system and a method for manufacturing the same, and more particularly, to a multi-layered coating material for parts of an engine exhaust system, which includes a first junction layer made of Ti or Cr, a second junction layer made of CrN or Ti(C)N, a support layer made of TiAlN/CrN, and a functional layer made of TiAlN/CrSi(C)N, all of which are stacked in sequence. The multi-layered coating of the present invention provides improved physical properties, particularly for sliding parts of an engine exhaust system, such as seizure resistance, abrasion resistance and heat resistance.

(b) Background Art

In recent years, as the regulations on automobile exhaust gas have been reinforced with the rise of environmental issues such as global warming, automakers have made attempts to develop a variety of environmentally friendly vehicles so as to reduce the carbon dioxide emissions to 50 g/km by 2020, which corresponds to 35 to 50% of the current carbon dioxide emissions.

More particularly, to satisfy the corporate average fuel economy (CAFE) standards of reducing the fuel efficiency to 54.5 mpg (23.2 km/l) by 2025, active research on technology associated with downsizing or fuel efficiency improvement has been conducted. In particular, an exhaust gas recirculation (EGR) system has been applied to achieve an increase in engine combustion efficiency and a decrease in generation of $NO_x$.

The EGR system is generally composed of a flat valve, a shaft, a bushing, a washer, a housing, etc. An actuator is provided outside the housing for opening/closing the flat valve. In this case, the parts (e.g., the flat valve and the bush, or the washer and the bushing) of the engine exhaust system are slid at a high temperature, thereby causing seizure, friction and abrasion of the washer, the flat valve and the bushing. As a result, the flat valve is not easily opened/closed due to the seizure, friction and abrasion of the washer, the flat valve and the bushing. Further, abrasion of the flat valve may cause degraded qualities, such as generation of alarm sounds or noises in the engine.

Therefore, various attempts have been made to prevent shortening of the lifespan of the parts of the engine exhaust system and to maintain performance of the parts. More particularly, active research on surface treatment has been conducted to improve physical properties such as seizure resistance, abrasion resistance, a low friction property, heat resistance, etc.

For example, a CrN coating has been applied in an attempt to maintain performance of the parts of the engine exhaust system, which is susceptible to abrasion due to the lack of high-temperature hardness. However, even with the CrN coating, hardness of the parts is lowered at a temperature of 500° C. or higher due to the lack of heat resistance and abrasion of the parts is facilitated due to the low seizure resistance.

In attempts to solve the problems regarding the CrN coating, heat-resistant coating materials such as TiAlN, CrTiSiN or TiAlCrN—CrON have also been used. However, these heat-resistant coating materials have difficulties in simultaneously improving the multiple physical properties (heat resistance, abrasion resistance, seizure resistance, a low friction property, etc.) of the coating material that are required for sliding parts to operate under a high-temperature environment.

When conventional coating materials, such as a CrN coating material or a TiAlN coating material, are applied to parts of a conventional EGR system, a seized product may be easily formed on surfaces of the parts due to the presence of carbides. In this case, the seized product is mainly responsible for lowering hardness of the parts and shortening the lifespan of the parts, which results from leakage or damage.

The description provided above as a related art of the present invention is just for helping understanding the background of the present invention and should not be construed as being included in the related art known by those skilled in the art.

SUMMARY OF THE DISCLOSURE

The present invention provides a coating material for parts of an engine exhaust system and a method for manufacturing the same. The coating material of the present invention provides excellent physical properties such as heat resistance, high-temperature stability and seizure resistance, as compared to a coating material used for parts of a conventional engine exhaust system, thereby resulting in extended lifespan of an engine.

According to one aspect, a coating material for parts of an engine exhaust system includes a second junction layer made of CrN or Ti(C)N and disposed on a surface of a substrate, a support layer made of TiAlN/CrN and disposed on a surface of the second junction layer, and a functional layer made of TiAlN/CrSiN or TiAlN/CrSiCN and disposed on a surface of the support layer.

According to various embodiments, the second junction layer has a thickness of about 0.1 to about 10 μm, the support layer may have a thickness of about 0.5 to about 10 μm, and the functional layer may have a thickness of about 0.5 to about 10 μm.

According to various embodiments, the coating material further includes a first junction layer disposed between the surface of the substrate and the second junction layer. The first junction layer may be made of Ti or Cr.

According to another aspect, the present invention provides a method for manufacturing a coating material for parts of an engine exhaust system which includes: changing an inside of a chamber from a vacuum state to a plasma state, depositing a second junction layer made of CrN or Ti(C)N on a surface of a substrate disposed in the chamber, depositing a support layer made of TiAlN/CrN on a surface of the second junction layer, and depositing a functional layer made of TiAlN/CrSiN or TiAlN/CrSiCN on a surface of the support layer.

According to various embodiments, the second junction layer has a thickness of about 0.1 to about 10 μm, the support layer has a thickness of about 0.5 to about 10 μm, and the functional layer has a thickness of about 0.5 to about 10 μm.

According to various embodiments, the depositing of the second junction layer is performed by depositing a first junction layer made of Ti or Cr on the surface of the substrate, followed by depositing the second junction layer.

According to various embodiments, the depositing of the support layer made of TiAlN/CrN is performed by depositing the support layer made of TiAlN/CrN so that Ti, Al and Cr in the support layer are provided at a ratio of about 1:1:1.

According to various embodiments, the depositing of the functional layer made of TiAlN/CrSiN is performed by depositing the functional layer made of TiAlN/CrSiN so that Ti, Al, Cr and Si in the functional layer are provided at a ratio of about 1:1:0.9:0.1.

According to various embodiments, the depositing of the functional layer made of TiAlN/CrSiCN is performed by depositing the functional layer made of TiAlN/CrSiCN so that Ti, Al, Cr, Si and C in the functional layer are provided at a ratio of about 1:1:0.8:0.1:0.1.

BRIEF DESCRIPTION OF THE DRAWINGS

The above and other features of the present invention will now be described in detail with reference to certain exemplary embodiments thereof illustrated the accompanying drawings which are given herein below by way of illustration only, and thus are not limitative of the present invention, and wherein.

Figure 1:
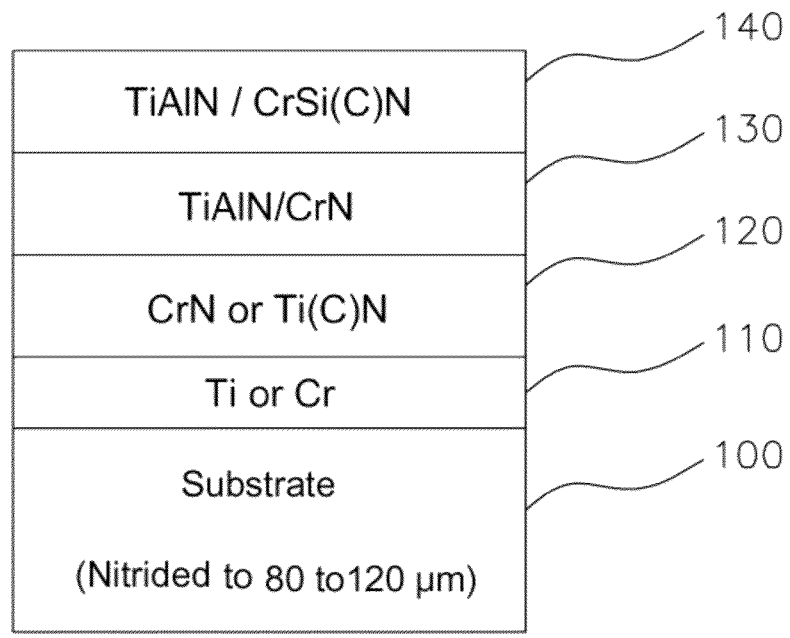
FIG. 1 is a diagram illustrating a configuration of a TiAlCrSiCN coating material according to one exemplary embodiment of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below.

Prior to the description, it should be understood that the terminology used in the specification and appended claims should not be construed as limited to general and dictionary meanings, but interpreted based on the meanings and concepts corresponding to technical aspects of the present invention on the basis of the principle that the present inventors are allowed to define the terms appropriately for the best explanation. Therefore, the description proposed herein is just a preferable example for the purpose of illustrations only, not intended to limit the scope of the invention, so it should be understood that other equivalents and modifications could be made thereto without departing from the scope of the invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

One aspect of present invention provides a coating material for parts of an engine exhaust system, which includes a functional layer made of TiAlCrSi(C)N as a main layer.

According to embodiments of the present invention, parts (e.g., a flat valve, a shaft, a bush, a washer, etc.) of an engine exhaust system are provided with high-quality physical properties required to cope with severe environments to which the parts of the engine exhaust system can be adapted. in the parts are provided with such properties through the use of improved coating materials which are capable of improving multiple physical properties of the parts, such as heat resistance, abrasion resistance and seizure resistance.

According to aspects of the present invention, a coating material is provided which is made of TiAlCrSi(C)N.

In the present invention, the term "TiAlCrSi(C)N" refers to TiAlCrSiN or TiAlCrSiCN, the term "TiAlN/CrSi(C)N" refers to TiAlN/CrSiN or TiAlN/CrSiCN, and the term "Ti(C)N" refers to TiN or TiCN.

FIG. 1 is a diagram illustrating a configuration of a TiAlCrSiCN coating material according to one exemplary embodiment of the present invention.

As shown in FIG. 1, the coating material according to one exemplary embodiment of the present invention includes a second junction layer 120 made of CrN or Ti(C)N and disposed on a surface of a substrate 100, a support layer 130 made of TiAlN/CrN, and a functional layer 140 made of TiAlN/CrSi(C)N, all of which are stacked in sequence. Preferably, the coating material according to one exemplary embodiment of the present invention further includes a first junction layer 110 disposed between a surface of the substrate 100 and the second junction layer 120. This first junction layer 110 is preferably made of Ti or Cr.

According to embodiments of the invention, when the substrate 100 is made of a material to be nitrided, a nitriding layer having a thickness of about 80 to about 120 μm may be formed by the nitriding process.

The first junction layer 110 made of Ti or Cr can be used to improve adhesion between a coating layer and the substrate 100. The second junction layer 120 made of CrN or Ti(C)N is can be used to minimize a residual stress of the coating layer and improve physical properties such as toughness, fatigue resistance and impact resistance.

According to various embodiments, the support layer 130 made of TiAlN/CrN can be in the formed of a multi-layered nanostructure. The support layer can be used to improve physical properties required for the parts of an engine exhaust system (such as a flat valve or a bush), such as toughness, heat resistance, anti-oxidation property and abrasion resistance.

According to various embodiments, the functional layer 140 made of TiAlN/CrSiN or TiAlN/CrSiCN can be in the form of a multi-layered nanostructure. The functional layer 140, can provide the materials with a seizure resistance through the use of silicon (Si), and a low friction property through the use of carbon (C), as well as heat resistance, anti-oxidation property and abrasion resistance.

The thickness of the second junction layer 120 is preferably in a range of about 0.1 to about 10 μm. When the thickness of the second junction layer 120 is less than about 0.1 μm, the content of the components of the second junction layer 120 is not sufficient to show the desired functions. On the other hand, when the thickness of the second junction layer 120 exceeds 10 μm, adhesion between the coating material and the substrate 100 may be degraded.

In addition, the support layer 130 made of TiAlN/CrN and the functional layer 140 made of TiAlN/CrSi(C)N, both of which may be provided with a multi-layered nanostructure, may each have a thickness of about 0.5 to about 10 μm. When the thickness of each of the support layer 130 and the functional layer 140 is less than about 0.5 μm, the multi-layered nanostructure may not be easily formed due to mixing of the two different layers, which makes it difficult to provide the desired effects of the present invention. On the other hand, when the thickness of each of the support layer 130 and the functional layer 140 each exceed about 10 μm, the coherency strain between the two layers may be out of balance, which leads to a decrease in hardness.

In general, it is very difficult to simultaneously improve conflicting physical properties, for example, abrasion resistance and impact resistance. However, the present invention enables simultaneous improvement, particularly by using the second junction layer 120 made of CrN or Ti(C)N, which have excellent impact resistance, as well as the support layer 130 made of TiAlN/CrN, which to has excellent abrasion resistance, and the functional layer 140 made of TiAlN/CrSi(C)N.

Another aspect of the present invention provides a method for manufacturing a coating material for parts of an engine exhaust system. The coating material may be prepared using a PVD method, and can include a functional layer made of TiAlCrSi(C)N as a main layer.

Methods of coating a surface of a metal substrate with a coating material are mainly divided into physical vapor deposition (PVD) methods and chemical vapor deposition (CVD) methods.

PVD is a dry processing method that provides negative polarity to a target material (substrate) and deposits an ionized metal material onto a surface of the target material using electrical attraction while supplying the ionized metal material in a steam state. In this case, the ionized metal material may be uniformly coated onto the surface of the substrate 100, and the adhesion may be enhanced using fine ion particles.

According to preferred embodiments, the present invention uses an arc, high-power impulse magnetron sputtering (HIPIMS) or inductive-coupled plasma (ICP) method. These methods generate high-density plasma, which allow for the formation of a nanostructure and high-speed coating of coating material particles.

Figure 2:
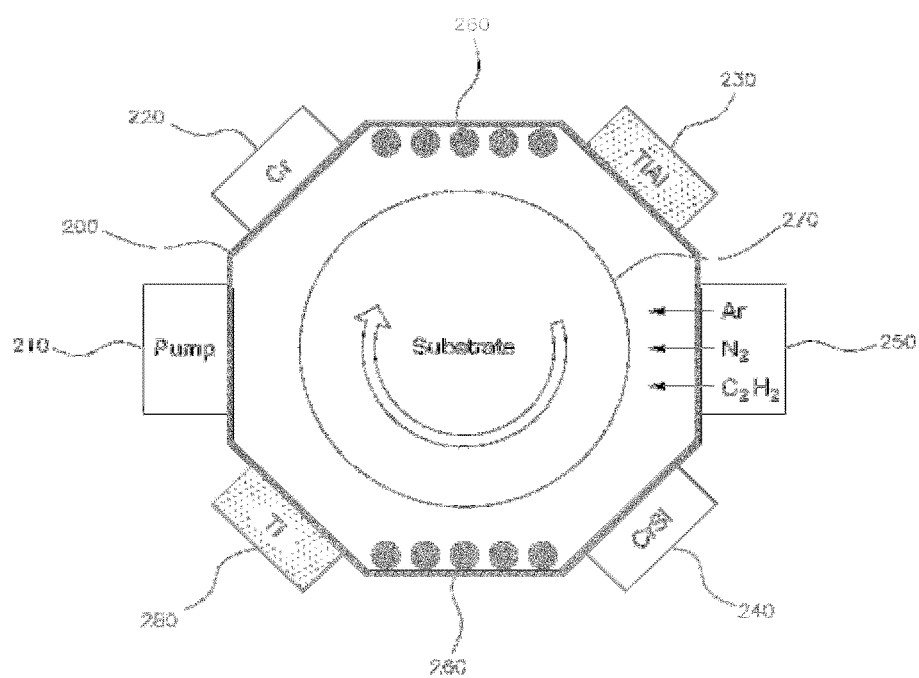
FIG. 2 is a diagram illustrating a physical vapor deposition (PVD) system configured to prepare a coating material according to one exemplary embodiment of the present invention.

FIG. 2 is a diagram illustrating a PVD system configured to prepare a coating material according to one exemplary embodiment of the present invention. As shown in FIG. 2, the PVD system can include a pump 210, a Cr target 220, a TiAl target 230, a CrSi target 240, a Ti target 280, a gas inlet 250 and a heating unit 260, disposed on a chamber 200, and a rotary holder 270 disposed within the chamber 200. Here, the substrate 100 is disposed on the rotary holder 270.

Ions required for respective layers constituting the coating material are supplied to each of the targets, and a desired gas, such as nitrogen gas or hydrocarbon gas (in some embodiments, preferably acetylene gas), is introduced into the chamber 200 through the gas inlet 250. In this case, nitrogen (N) ions may be supplied as the nitrogen gas, and carbon (C) ions may be supplied as the hydrocarbon gas.

According to various embodiments, a material that can be subjected to a nitriding process before the coating process may be coated after undergoing a nitriding process, followed by removing a compound layer.

According to an exemplary method, first, as pretreatment of the coating, an inside of the chamber 200 is changed into a vacuum state using a pump 210 or the like, and is then changed into a plasma state by introducing argon gas or the like through the gas inlet 250.

Next, the chamber 200 is heated to a suitable temperature, such as about 80° C., using the heating unit 260 to activate a surface of the substrate 100. The surface of the substrate 100 is then cleaned by applying a bias voltage to allow positive argon ions to collide with the surface of the substrate 100 (Baking & Cleaning).

Thereafter, nitrogen gas is introduced into the chamber 200 through the gas inlet 250 to form a nitrogen atmosphere in the chamber 200. Then, the second junction layer 120 is deposited on the surface of the substrate 100. For example a CrN junction layer 120 may be deposited using the nitrogen gas and the Cr target 220. Alternatively, a TiN second junction layer 120 may be deposited on the surface of the substrate 100 using the nitrogen gas and the Ti target 280. Preferably, the second junction layer 120 is deposited to a thickness of about 0.1 to about 10 μm. Here, when acetylene gas is introduced with the nitrogen gas, the second junction layer 120 made of TiCN may be deposited (PVD method).

According to some embodiments, the first junction layer 110 made of Ti or Cr is further deposited on the surface of substrate 100 using the Ti target 280 or the Cr target 220 prior to deposition of the second junction layer 120 (PVD method). This first junction layer 110 is optional.

Next, the support layer 130 made of TiAlN/CrN is deposited. According to an exemplary embodiment, the support layer 130 is provided so as to have a multi-layered nanostructure, in which TiAlN layers and CrN layers are alternately stacked on a surface of the second junction layer 120 by partly exposing the substrate 100, on which the second junction layer 120 (and, in some embodiments, the first and second junction layers 110, 120) is deposited, to the TiAl target 230 and the Cr target 220 under a nitrogen atmosphere using the rotary holder 270. According to a preferred embodiment, the support layer 130 is deposited to a thickness of about 0.5 to about 10 μm (PVD method).

In this case, the support layer 130 made of TiAlN/CrN is provided so as to improve the toughness, heat resistance, anti-oxidation property and abrasion resistance of the substrate 100. In a preferred embodiment, the Ti, Al and Cr in the support layer 130 are deposited at a ratio of 1:1:1 based on alternate stacking of the respective layers so as to maximize the effects of the respective layers.

Thereafter, the functional layer 140 is provided on a surface of the support layer. According to an exemplary embodiment, the functional layer 140 is made of TiAlN/CrSiN, and preferably has a multi-layered nanostructure, in which TiAlN layers and CrSiN layers are alternately stacked on a surface of the support layer 130. According to a method of the present invention, TiAlN layers and CrSiN layers are alternately stacked on a surface of the support layer 130 by partly exposing the substrate 100 on which the support layer 130 is deposited to the TiAl target 230 and the CrSi target 240 under a nitrogen atmosphere using the rotary holder 270. According to an exemplary embodiment, the support layer 130 is deposited to a thickness of about 0.5 to about 10 μm. When acetylene gas is introduced with the nitrogen gas, the functional layer 140 made of TiAlN/CrSiCN may be deposited (PVD method).

In this case, the functional layer 140 made of TiAlN/CrSi(C)N may be provided to improve seizure resistance and a low friction property as well as physical properties such as heat resistance, anti-oxidation property and abrasion resistance. According to a preferred embodiment, Ti, Al, Cr and Si, or Ti, Al, Cr, Si and C in the functional layer 140 are deposited at a ratio of 1:1:0.9:0.1 or 1:1:0.8:0.1:0.1 in an alternate stacking arrangement of the respective layers so as to maximize their desired effects.

Table 1 lists the high-temperature friction coefficients, abrasion properties and seizure properties of the conventional coating material and the coating material according to an embodiment of the present invention for the purpose of comparison. In the case of a conventional product (Inconel 713 C), a coating material had an abrasion of 15.1 mg, a counterpart material had an abrasion of 120.3 mg, and the coating material and the counterpart material had a friction coefficient of 0.85 and a good seizure property.

In this case, the friction coefficient was calculated by measuring a friction coefficient between a coating (disc) and a pin (SUJ2) using a pin-on-disc wear tester. The test conditions included a sliding distance of 2,000 m, a load of 20 N, a rate of 0.1 m/s, and an atmospheric temperature of 700° C., and the seizure property was evaluated after the test.

As listed in Table 1, it was revealed that the coating material and counterpart material according to the present invention were measured to have the lowest abrasions of 1.48 mg and 17.1 mg, respectively, compared with the conventional coating material, which results from a low friction coefficient. Therefore, it could be seen that the coating material and counterpart material according to the present invention had excellent abrasion resistance and abrasion-attacking property, compared with the conventional coating material.

Figure 3:
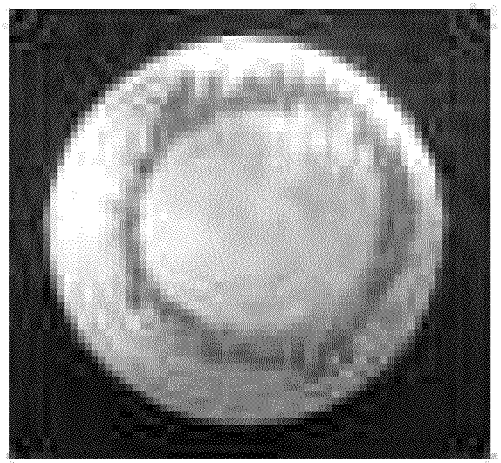
FIG. 3 is an image taken by testing a conventional coating material, followed by evaluating a seizure property of the conventional coating material.
Figure 4:
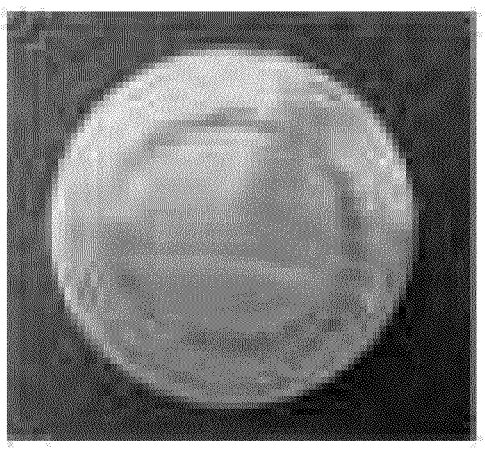
FIG. 4 is an image taken by testing the friction abrasion of a coating material of Comparative Example 1, followed by evaluating a seizure property of the coating material.
Figure 5:
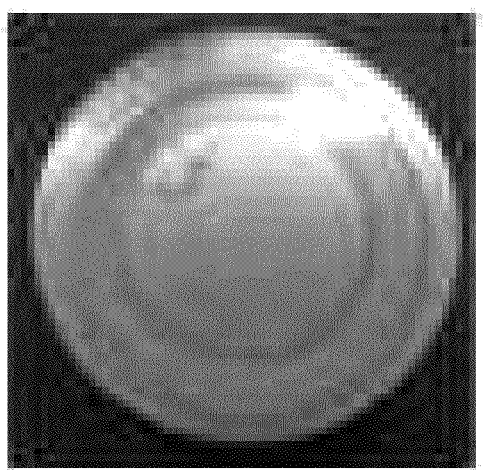
FIG. 5 is an image taken by testing the friction abrasion of a coating material of Comparative Example 2, followed by evaluating a seizure property of the coating material.
Figure 6:
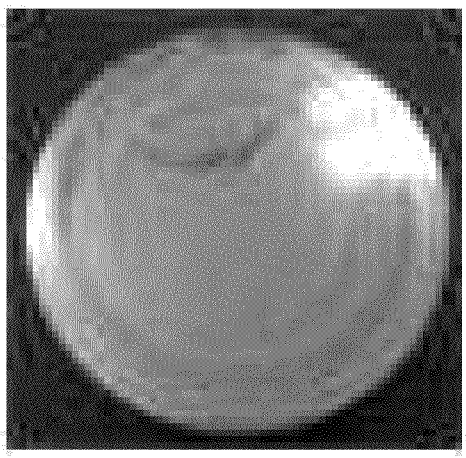
FIG. 6 is an image taken by testing the friction abrasion of a coating material of Comparative Example 3, followed by evaluating a seizure property of the coating material.
Figure 7:
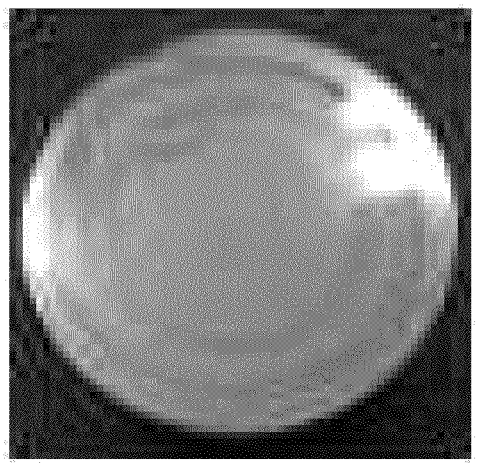
FIG. 7 is an image taken by testing the friction abrasion of a coating material of Example 1, followed by evaluating a seizure property of the coating material according to one exemplary embodiment of the present invention.

Also, FIG. 3 is an image taken by testing a conventional coating material, followed by evaluating a seizure property of the conventional coating material. FIGS. 4 to 6 are images taken by testing the friction abrasions of coating materials of Comparative Examples 1 to 3, followed by evaluating seizure properties of the coating materials, respectively. FIG. 7 is an image taken by testing the friction abrasion of a coating material of Example 1, followed by evaluating a seizure property of the coating material. From the results obtained by comparing the images shown in FIGS. 3 to 7, it could be seen that, unlike the comparative examples, a seized product was hardly observed when the coating material according to the present invention was used, which indicates that the coating material according to the present invention has an effect of improving the seizure resistance.

The coating material having the described-above configuration according to the present invention improves physical properties such as seizure resistance, heat resistance and abrasion resistance, compared with the parts of the conventional engine exhaust system such as an EGR system being coated with a conventional coating material, thereby improving qualities of the engine parts and maintaining life spans of the engine parts.

Also, the coating material according to the present invention reduces the friction coefficients of the sliding parts of the engine exhaust system to prevent abrasion of the parts caused by the friction under a high-temperature condition, thereby preventing a decrease in power of an engine and noise generation from the engine.

TABLE 1

|  | Comparative Example 1 | Comparative Example 2 | Comparative Example 3 | Example 1 |
| --- | --- | --- | --- | --- |
| Surface treatment/coating | CrN | TiAlN | CrTiSiN | TiAlCrSiCN |
| Method | PVD | PVD | PVD | PVD |
| Coating thickness (μm) | 30 | 9.5(5CrN—4.5TiAlN) | 10(5CrN—5CrTiSiN) | 10(4CrN/4TiAlCrN—2TiAlCrCN) |
| Abrasion (mg) of coating material (disc) | 7.5 | 2.3 | 2.2 | 1.48 |
| Abrasion (mg) of counterpart material (pin) | 51.2 | 29 | 32 | 17.1 |
| Friction coefficient | 0.63 | 0.69 | 0.72 | 0.42 |
| Seizure property | Medium | Medium | Low | Low |

Furthermore, the present invention provides a coating technique and coating that demonstrate excellent physical properties under severe environments to cope with an increase in exhaust temperature according to Euro 6 and 7 regulations regarding the exhaust gas emission in the future.

The invention has been described in detail with reference to preferred embodiments thereof. However, it will be appreciated by those skilled in the art that changes may be made in these embodiments without departing from the principles of the invention, the scope of which is defined in the appended claims and their equivalents.

What is claimed is:

1. A method for manufacturing a coating material for parts of an engine exhaust system, comprising:
   changing an inside of a chamber from a vacuum state to a plasma state;
   optionally depositing a first junction layer of Ti or Cr on a surface of a substrate disposed in the chamber;
   depositing a second junction layer of CrN or Ti(C)N on a surface of the first junction layer or on a surface of the substrate;
   depositing a support layer of TiAlN/CrN on a surface of the second junction layer; and
   depositing a functional layer of TiAlN/CrSiN or TiAlN/CrSiCN on a surface of the support layer,
   wherein the depositing of the functional layer made of TiAlN/CrSiN is performed by depositing the functional layer so that Ti, Al, Cr and Si are provided in the functional layer at a ratio of 1:1:0.9:0.1,
   wherein the depositing of the functional layer made of TiAlN/CrSiCN is performed by depositing the functional layer so that Ti, Al, Cr, Si and C are provided in the functional layer at a ratio of 1:1:0.8:0.1:0.1.

2. The method of claim 1, wherein the second junction layer is deposited at a thickness of about 0.1 to about 10 μm, the support layer is deposited at a thickness of about 0.5 to about 10 μm, and the functional layer is deposited at a thickness of about 0.5 to about 10 μm.

3. The method of claim 1, wherein the first junction layer is first deposited on the surface of the substrate followed by depositing the second junction layer on a surface of the first junction layer.

4. The method of claim 1, wherein the depositing of the support layer made of TiAlN/CrN is performed by depositing the support layer so that Ti, Al and Cr are provided in the support layer at a ratio of 1:1:1.

* * * * *